United States Patent
Park et al.

(10) Patent No.: US 8,575,649 B2
(45) Date of Patent: Nov. 5, 2013

(54) DONOR SUBSTRATE AND METHOD OF FABRICATING ORGANIC LIGHT EMITTING DIODE USING THE SAME

(75) Inventors: Jin-Woo Park, Yongin (KR); Myung-Jong Jung, Yongin (KR); Sang-Woo Pyo, Yongin (KR); Hyo-Yeon Kim, Yongin (KR); Dae-Hoon Kim, Yongin (KR); Tae-Min Kang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 414 days.

(21) Appl. No.: 12/904,102

(22) Filed: Oct. 13, 2010

(65) Prior Publication Data

US 2011/0084286 A1    Apr. 14, 2011

(30) Foreign Application Priority Data

Oct. 13, 2009   (KR) .................. 10-2009-0097435

(51) Int. Cl.
  *H01L 23/02*   (2006.01)
  *B32B 9/00*    (2006.01)
(52) U.S. Cl.
  USPC .......................................... 257/179; 428/690
(58) Field of Classification Search
  USPC .......................................... 257/179; 428/690
  See application file for complete search history.

(56) References Cited

U.S. PATENT DOCUMENTS

| | | | |
|---|---|---|---|
| 5,998,085 A | 12/1999 | Isberg et al. | |
| 6,114,088 A | 9/2000 | Wolk et al. | |
| 6,214,520 B1 | 4/2001 | Wolk et al. | |
| 6,855,384 B1 | 2/2005 | Nirmal et al. | |
| 2004/0191564 A1 | 9/2004 | Kim et al. | |
| 2005/0048295 A1* | 3/2005 | Kim et al. | 428/447 |
| 2005/0123850 A1 | 6/2005 | Wolk | |
| 2006/0051533 A1* | 3/2006 | Song et al. | 428/32.81 |

FOREIGN PATENT DOCUMENTS

| | | |
|---|---|---|
| JP | 2004-510289 A | 4/2004 |
| JP | 2006-080051 A | 3/2006 |
| JP | 2007-515755 A | 6/2007 |
| JP | 2008-270271 A | 11/2008 |
| KR | 10-1998-0051814 | 9/1998 |

(Continued)

OTHER PUBLICATIONS

Korean Notice of Allowance dated Sep. 28, 2011 for Korean Patent Application No. KR 10-2009-0097435 which corresponds to captioned U.S. Appl. No. 12/904,102.

(Continued)

*Primary Examiner* — Long K Tran
(74) *Attorney, Agent, or Firm* — Knobbe Martens Olson & Bear LLP (57) ABSTRACT

A donor substrate for laser induced thermal imaging and a method of fabricating an organic light emitting diode (OLED) using the donor substrate are disclosed. In one embodiment, the donor substrate includes a base film, a light-to-heat conversion layer formed on the base film, a buffer layer formed on the light-to-heat conversion layer, and a transfer layer formed on the buffer layer. The buffer layer is formed of magnesium (Mg), an Mg alloy, or magnesium oxide. In the donor substrate for laser induced thermal imaging, the buffer layer is formed between the interlayer and the transfer layer or between the light-to-heat conversion layer and the transfer layer, so that surface characteristics between the donor substrate and the transfer layer can be improved.

15 Claims, 7 Drawing Sheets

(56) References Cited

FOREIGN PATENT DOCUMENTS

| | | |
|---|---|---|
| KR | 10-1998-051814 A | 9/1998 |
| KR | 10-0195175 B1 | 2/1999 |
| KR | 10-2005-0063534 A | 6/2005 |
| KR | 10-2006-0023056 A | 3/2006 |
| KR | 10-0667067 B1 | 1/2007 |
| KR | 10-0731766 B1 | 6/2007 |
| KR | 10-2007-0111702 A | 11/2007 |
| WO | WO 2006/046566 A1 | 5/2006 |

OTHER PUBLICATIONS

Japanese Office Action dated Feb. 14, 2012 for Japanese Patent Application No. JP 2010-163738 which shares priority of Korean Patent Application No. KR 10-2009-0097435 with captioned U.S. Appl. No. 12/904,102.

Japanese Office Action dated Sep. 4, 2012 for Japanese Patent Application No. JP 2010-163738 which shares priority of Korean Patent Application No. KR 10-2009-0097435 with captioned U.S. Appl. No. 12/904,102.

* cited by examiner

DONOR SUBSTRATE AND METHOD OF FABRICATING ORGANIC LIGHT EMITTING DIODE USING THE SAME

CROSS-REFERENCE TO RELATED APPLICATION

This application claims the benefit of Korean Patent Application No. 2009-97435, filed Oct. 13, 2009, the disclosure of which is hereby incorporated herein by reference in its entirety.

BACKGROUND OF THE INVENTION

1. Field of the Invention

The present invention relates to a donor substrate and a method of fabricating an organic light emitting diode (OLED) using the same and, more particularly, to a donor substrate used to form the organic layer of an OLED and a method of fabricating the OLED using the same

2. Description of the Related Technology

In general, organic light emitting diodes (OLEDs) are each formed of multiple layers such as positive and negative electrodes, a hole injection layer, a hole transport layer, an emission layer, an electron transport layer, an electron injection layer, and so on. The OLEDs are divided into small molecule OLEDs and polymer OLEDs according to the material used. In the case of the small molecule OLEDs, each layer may be formed by vacuum deposition. In the case of the polymer OLEDs, a light emitting diode may be formed by a spin coating process.

SUMMARY OF CERTAIN INVENTIVE ASPECTS

One aspect of the present invention is a donor substrate for laser induced thermal imaging capable of preventing poor transfer in the case where an emission layer is formed using the laser induced thermal imaging when an organic light emitting diode (OLED) is fabricated.

Another aspect of the present invention is a donor substrate for laser induced thermal imaging which includes: a base film; a light-to-heat conversion layer formed on the base film; a buffer layer formed on the light-to-heat conversion layer; and a transfer layer formed on the buffer layer. The buffer layer is formed of magnesium (Mg), an Mg alloy, or magnesium oxide.

Another aspect of the present invention is a donor substrate for laser induced thermal imaging which includes a base film, a light-to-heat conversion layer, a buffer layer, and a transfer layer. The transfer layer is formed on the buffer layer, and the buffer layer is formed of magnesium (Mg), an Mg alloy, or magnesium oxide.

The buffer layer may have a thickness of 1 µm or less.

The buffer layer may have a laser beam transmittance of 20% or less.

The donor substrate may further include an interlayer formed on the light-to-heat conversion layer, and the buffer layer may be formed on the interlayer.

The interlayer may be formed of acrylic resin or alkyd resin.

Another aspect of the present invention is a method of fabricating an organic light emitting diode (OLED) which includes: providing an OLED substrate having a lower electrode layer; forming a donor substrate, which is spaced apart from the OLED substrate and includes a base film, and a light-to-heat conversion layer, a buffer layer, and a transfer layer on the base film, such that the transfer layer is directed toward the OLED substrate; and applying laser beams to a predetermined region of the donor substrate, and transferring the transfer layer onto the lower electrode layer to form an organic layer pattern on the lower electrode layer. The transfer layer is formed on the buffer layer, and the buffer layer is formed of magnesium (Mg), an Mg alloy, or magnesium oxide. Another aspect of the invention is a donor substrate for laser induced thermal imaging, comprising: a base film; a light-to-heat conversion layer formed on the base film; a buffer layer formed of at least one of: magnesium (Mg), an Mg alloy, or magnesium oxide; and a transfer layer contacting the buffer layer, wherein the buffer layer is formed between the transfer layer and the light-to-heat conversion layer.

In the above donor substrate, the buffer layer has a thickness of about 1 µm or less. In the above donor substrate, the buffer layer has a laser beam transmittance of about 20% or less. In the above donor substrate, the light-to-heat conversion layer comprises one of i) an organic layer, and ii) a metal layer formed of metal, metal oxide, metal sulfide or a combination thereof, and wherein the organic layer and the metal layer comprise a laser beam absorbing material.

The above donor substrate further comprises an interlayer interposed between the light-to-heat conversion layer and the buffer layer. In the above donor substrate, the interlayer is formed of acrylic resin or alkyd resin. In the above donor substrate, the transfer layer comprises at least one of: i) an emission layer, ii) a hole injection layer, iii) a hole transport layer, iv) an electron injection layer, and v) an electron transport layer.

Another aspect of the invention is a donor substrate for laser induced thermal imaging, comprising: a base film comprising first and second surfaces opposing each other, wherein the base film is configured to receive light via the first surface and at least partially transmit the light via the second surface; a light-to-heat conversion layer contacting the second surface of the base film and configured to partially convert the light into heat; a transfer layer configured to transfer at least a portion thereof based on the heat; and a buffer layer formed between the light-to-heat conversion layer and the transfer layer, wherein the buffer layer is formed of at least one of: magnesium (Mg), an Mg alloy, or magnesium oxide.

In the above donor substrate, the buffer layer has a thickness of about 1 µm or less. In the above donor substrate, the buffer layer has a laser beam transmittance of about 20% or less. In the above donor substrate, the light-to-heat conversion layer comprises one of i) an organic layer, and ii) a metal layer formed of metal, metal oxide, metal sulfide or a combination thereof, wherein the organic layer and the metal layer comprises a laser beam absorbing material.

The above donor substrate further comprises an interlayer formed interposed between the light-to-heat conversion layer and the buffer layer. In the above donor substrate, the interlayer is formed of acrylic resin or alkyd resin. In the above donor substrate, the transfer layer comprises at least one of: i) an emission layer, ii) a hole injection layer, iii) a hole transport layer, iv) an electron injection layer, and v) an electron transport layer. In the above donor substrate, the base film is formed of a transparent polymeric material and having a thickness of about 10 µm to about 500 µm.

Another aspect of the invention is a method of fabricating an organic light emitting diode (OLED), comprising: providing an OLED substrate comprising a lower electrode layer; providing a donor substrate to be spaced apart from the OLED substrate, wherein the donor substrate comprises i) a base film, ii) a light-to-heat conversion layer contacting the base film, iii) a transfer layer directed toward the OLED substrate and iv) a buffer layer formed between the transfer layer and the light-to-heat conversion layer, wherein the buffer layer is formed of magnesium (Mg), an Mg alloy, or magnesium oxide; and applying laser beam to the base film of the donor substrate, such that at least a portion of the transfer layer is transferred onto the lower electrode layer to form an organic layer pattern on the lower electrode layer.

In the above method, the donor substrate further comprises an interlayer interposed between the light-to-heat conversion layer and the buffer layer. In the above method, the interlayer is formed of acrylic resin or alkyd resin. In the above method, the at least portion of the transfer layer is transferred multiple times. In the above method, the buffer layer has a thickness of about 1 µm or less and a laser beam transmittance of about 20% or less.

DETAILED DESCRIPTION OF CERTAIN INVENTIVE EMBODIMENTS

In the case of monochromatic OLEDs, the polymer OLEDs may be simply fabricated by a spin coating process. Although a driving voltage thereof is low, the OLEDs suffer from low efficiency, and short lifespan, compared to the small molecule OLEDs. Further, in the case of full-color OLEDs, red, green and blue polymer layers are patterned. When ink jet printing or laser induced thermal imaging is used, emission characteristics such as efficiency, lifespan, etc., are reduced.

In particular, when the patterning is performed using laser induced thermal imaging, most homopolymer materials are not transferred. A method of forming a pattern of a polymer OLED using the laser induced thermal imaging has already been disclosed in Korean Patent No. 1998-51814, and U.S. Pat. Nos. 5,998,085, 6,214,520 and 6,114,088.

To apply laser induced thermal imaging, a light source, a transfer film, and a substrate are used. Light emitted from the light source is absorbed by a light absorption layer of the transfer film, and converted into thermal energy. Then a material forming a transfer layer of the transfer film is transferred to the substrate by the thermal energy, thereby forming a desired image.

Figure 1:
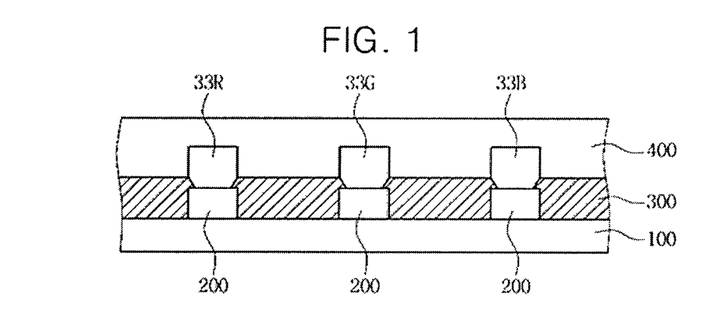
FIG. 1 is a cross-sectional view illustrating the structure of a typical full-color OLED.

FIG. 1 is a cross-sectional view illustrating the structure of a typical full-color OLED. Referring to FIG. 1, a first electrode 200 is patterned on an insulating substrate 100. The first electrode 200 is formed as a transparent electrode in the case of a bottom emission structure, and is formed of a conductive metal layer including a reflective layer in the case of a top emission structure.

A pixel definition layer (PDL) 300 is formed on the first electrode 200 and formed of an insulating material to define a pixel region and to insulate emission layers from each other.

An organic layer including organic emission layers 33R, 33G and 33B is formed within the pixel region defined by the PDL 300. The organic layer may further include at least one of a hole injection layer, a hole transport layer, a hole blocking layer, an electron transport layer, and an electron injection layer. Both a polymer material and a small molecule material may be used for the organic emission layers.

Then, a second electrode 400 is formed on the organic layer 33. In the case where the first electrode 200 is a transparent electrode, the second electrode 400 is formed of a conductive metal layer including a reflective layer. In the case where the first electrode 200 is a conductive metal layer including a reflective layer, the second electrode 400 is formed as a transparent electrode. Afterwards, the OLED is encapsulated and thus completed.

Figure 2:
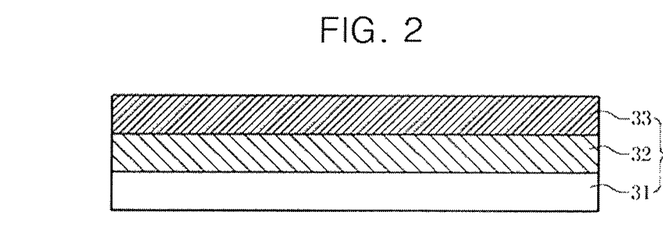
FIG. 2 is a cross-sectional view illustrating the configuration of a donor substrate for laser induced thermal imaging.

FIG. 2 is a cross-sectional view illustrating the configuration of a donor substrate for laser induced thermal imaging. Referring to FIG. 2, a donor substrate 34 for laser induced thermal imaging includes a base film 31, a light-to-heat conversion layer 32, and a transfer layer 33. An interlayer 35 (see FIG. 3) may be interposed between the light-to-heat conversion layer 32 and the transfer layer 33 such that contamination generated from the light-to-heat conversion layer 32 is not transferred to the organic transfer layer 33.

Figure 3:
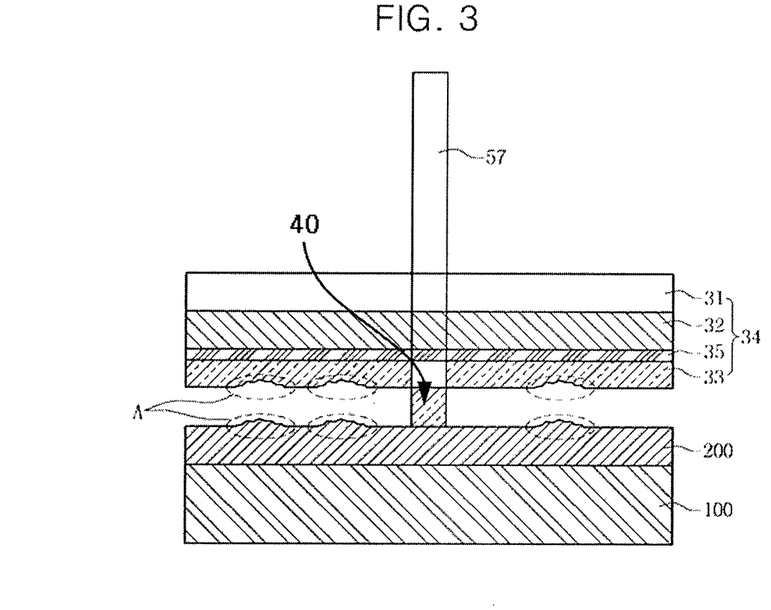
FIG. 3 is a cross-sectional view illustrating a transfer model when a donor substrate is used.

FIG. 3 is a cross-sectional view illustrating a transfer model when a donor substrate is used. Referring to FIG. 3, when irradiated with laser light 57, the light-to-heat conversion layer 32 is expanded. As a result, a portion of the transfer layer 40 is expanded, separated from the donor substrate, and transferred to a substrate of the OLED.

However, due to poor adhesive strength between the transfer layer 33 and the donor substrate, as in part A of FIG. 3, the OLED substrate is stained with an organic material on the donor substrate when a laminating process is performed. As such, the OLED substrate can be covered with an undesired organic material on a region other than the portion to be transferred. This can result in increased deterioration in performance of the OLED.

Embodiments of the present invention will now be described more fully hereinafter with reference to the accompanying drawings, in which exemplary embodiments of the invention are shown. This invention may, however, be embodied in different forms and should not be construed as limited to the embodiments set forth herein. In the drawings, when it is mentioned that a layer is disposed "on" another layer or a substrate, it means that the layer may be directly formed on the other layer or a third layer may be interposed therebetween. In addition, the thickness of layers and areas may be exaggerated for clarity. Like reference numerals designate like elements throughout the specification.

Figure 4:
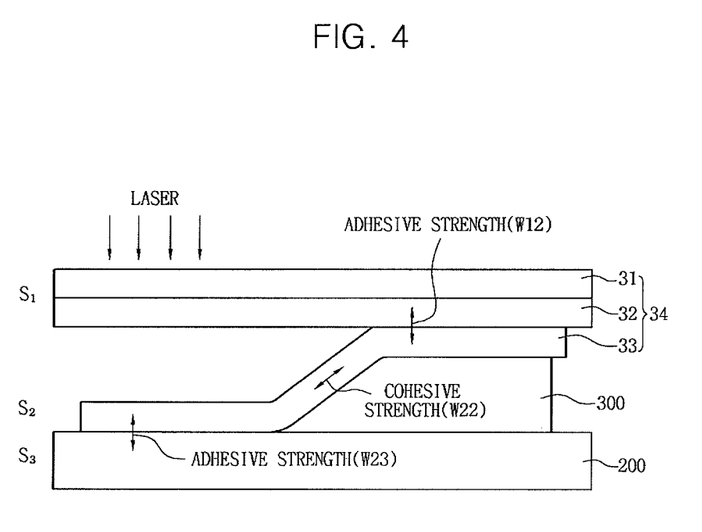
FIG. 4 illustrates a transfer mechanism when an organic emission layer used for an OLED is transfer-patterned using laser beams according to an exemplary embodiment of the present invention.

FIG. 4 illustrates a transfer mechanism when an organic emission layer used for an organic light emitting diode (OLED) is transfer-patterned using laser beams according to an exemplary embodiment of the present invention.

In one embodiment, as can be seen from FIG. 4, a mechanism in which an organic layer 33 is transfer-patterned using laser beams is typically configured such that the organic layer 33 or S2 bonded to a substrate S1 is separated from the substrate S1 by action of the laser beams and then transferred to another substrate S3. In one embodiment, in the organic layer 33 or S2, a portion to which the laser beams are applied is separated from a portion to which the laser beams are not applied.

Transfer characteristics may be affected by three factors: a first adhesive strength W12 between the substrate S1 and the film S2; a cohesive strength W22 of the film; and a second adhesive strength W23 between the film S2 and the substrate S3.

The first and second adhesive strengths and the cohesive strength may be expressed in terms of surface tensions $\gamma 1$, $\gamma 2$ and $\gamma 3$ of respective layers and interfacial tensions $\gamma 12$ and $\gamma 23$, as follows.

$$W12 = \gamma 1 + \gamma 2 - \gamma 12$$

$$W22 = 2\gamma 2$$

$$W23 = \gamma 2 + \gamma 3 - \gamma 23$$

In one embodiment, to improve the transfer characteristics of the laser beams, the cohesive strength of the film is less than the adhesive strength between the substrate and the film.

In the OLED, an organic material is generally used as a material for each layer. In the case of the organic material, the first or second adhesive strength may be greater than the cohesive strength. As such, a mass transition occurs in such a manner that an emission material is transferred from a donor substrate 34. In one embodiment, the donor substrate 34 includes a base film 31 and a light-to-heat conversion (LTHC) layer 32, to a substrate 200 on which the OLED is formed. Through this transfer, it is possible to form a fine pattern of an emission layer and reduce a possibility of misalignment.

Figure 5:
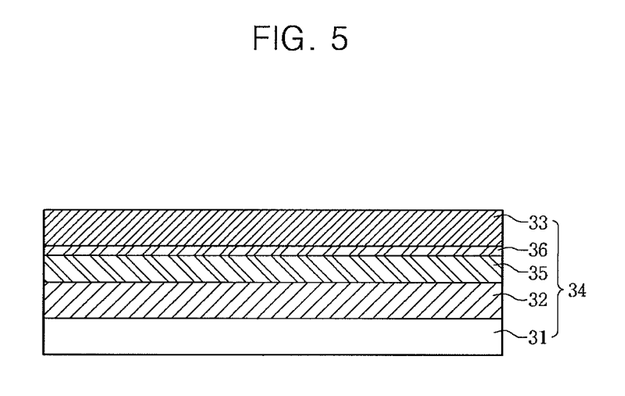
FIG. 5 is a cross-sectional view for explaining a donor substrate and a method of fabricating the same according to an exemplary embodiment of the present invention.

FIG. 5 is a cross-sectional view for explaining a donor substrate and a method of fabricating the same according to an exemplary embodiment of the present invention.

Referring to FIG. 5, a base film 31 is prepared, and an LTHC layer 32 is formed on the base film 31.

The base film 31 may be made of a transparent polymeric material. As this polymeric material, polyester, such as polyethylene terephthalate, poly acryl, polyepoxy, polyethylene, polystyrene, or the like is used. Among them, polyethylene terephthalate is often used. In one embodiment, the base film 31 has an optical property and mechanical stability as a supporting film. The base film 31 may have a thickness of about 10 μm to about 500 μm.

The LTHC layer 32 generally absorbs light from an infrared region to a visible ray region and converts some of the light into heat. In one embodiment, the LTHC layer 32 has optical density and includes a light-absorbing material. Examples of the LTHC layer 32 include: a metal layer including aluminum oxide or aluminum sulfide serving as the light-absorbing material; and a polymeric organic layer including carbon black, graphite or infrared dye serving as the light-absorbing material. Here, in the case of the metal layer, the LTHC layer 32 may be formed to a thickness of about 100 Å to about 5000 Å using vacuum deposition, electron beam deposition or sputtering. In the case of the organic layer, the LTHC layer 32 may be formed to a thickness of about 0.1 μm to about 10 μm using a typical film coating method such as roll coating, gravure, extrusion, spin coating, or knife coating.

Subsequently, an interlayer 35 may be formed on the LTHC layer 32. In one embodiment, the interlayer 35 serves to prevent the light-absorbing material, for instance carbon black, included in the LTHC layer 32 from contaminating a transfer layer 33 formed in the subsequent process. The interlayer 35 may be formed of acrylic resin or alkyd resin. The interlayer 35 may be formed by a typical coating process such as a solvent coating process and a curing process such as an infrared curing process.

In one embodiment, a buffer layer 36 is formed on the LTHC layer 32 or the interlayer 35 if the interlayer 35 is formed. In one embodiment, the buffer layer 36 prevents damage to the transfer material, i.e., the organic layer formed on the transfer layer 33. The buffer layer 36 may effectively adjust a adhesive strength between the transfer layer 33 and the donor substrate 34, i.e., between the transfer layer 33 and the LTHC layer 32, or between the transfer layer 33 and the interlayer 35 if the interlayer 35 is formed.

The buffer layer 36 may be formed of a metal layer or a metal oxide layer. In the case of the metal layer, the buffer layer 36 may be formed by vacuum deposition, electron beam deposition or sputtering. In the case of the metal oxide layer, the buffer layer 36 may be formed by a typical film coating method such as roll coating, gravure, extrusion, spin coating, or knife coating. Alternatively, the buffer layer 36 may be formed by forming the metal layer and then oxidizing a surface of the metal layer.

The buffer layer 36 may be formed of magnesium (Mg) or an Mg alloy in the case of the metal layer, and magnesium oxide (MgO) in the case of the metal oxide layer.

In one embodiment, the buffer layer 36 uses a metal or metal oxide having a laser beam transmittance of about 20% or less. Further, the buffer layer 36 may have a thickness of about 1 μm or less.

The buffer layer 36 may have such a thickness as to prevent laser beam energy and heat energy of the LTHC layer 32 from being transmitted to the material of the transfer layer 33 to protect thermal deformation of the material. Although the buffer layer 36, having a thickness of about 1 μm or less, may provide desirable transfer characteristic, the buffer layer 36 may have a thickness greater than about 1 μM, depending on embodiments.

Here, the buffer layer 36 may improve the adhesive strength between the transfer layer 33 and the donor substrate 34 to prevent a region other than a region to be transferred from being stained by the transfer layer 33.

Then, the transfer layer 33 is formed on the buffer layer 36.

The transfer layer 33 may include one or more layers selected from the group consisting of organic layers such as an emission layer, a hole injection layer, a hole transport layer, an electron injection layer, an electron transport layer, and so on. In one embodiment, each organic layer includes a small molecule material. In one embodiment, the organic layer including the small molecule material is generally poor in adhesive strength, and thus the transfer characteristic thereof is improved by use of the buffer layer 36. Further, some of the small molecule materials have low thermal stability. As such, the transfer layer 33 including such a small molecule material may be damaged by heat generated from the LTHC layer 32 in the transfer process based on laser induced thermal imaging (LITI). However, since the buffer layer 36 may adjust the heat, this damage caused by the heat may be prevented.

The organic layers, for instance, the emission layer, the hole injection layer, the hole transport layer, the electron injection layer, and the electron transport layer, may be formed of any material used typically.

The emission layer may use: a red emission material including, but not limited to, a small molecule material such as $Alq_3$ (host)/DCJTB (fluorescent dopant), $Alq_3$ (host)/DCM (fluorescent dopant), or CBP (host)/PtOEP (phosphorescent organic metal complex) and a polymer material such as a PFO-based polymer, or a PPV-based polymer; a green emission material such as a small molecule material such as $Alq_3$, $Alq_3$ (host)/C545t (dopant), or CBP (host)/IrPPy (phosphorescent organic metal complex) and a polymer material such as a PFO-based polymer or a PPV-based polymer; and a blue emission material such as a small molecule material such as DPVBi, spiro-DPVBi, spiro-6P, distilled benzene (DSB), or distilled arylene (DSA) and a polymer material such as a PFO-based polymer or a PPV-based polymer.

The hole injection layer may use a small molecule material such as CuPc, TNATA, TCTA or TDAPB, and a polymer material such as PANI or PEDOT. The hole transport layer may use a small molecule material based on, for instance, aryl amine, hydrazone, still-benzene, or starburst including NPB, TPD, s-TAD, or MTADATA, and a polymer material based on, for instance, carbazol, aryl amine, perillene, or pyrole including PVK.

The electron transport layer may use a polymer material such as PBD, TAZ, or Spiro-PBD, and a small molecule material such as $Alq_3$, BAlq, or SAlq. Further, the electron injection layer may use a small molecule material such as $Alq_3$, Ga complex, or PBD, and a polymer material based on oxadiazole.

The transfer layer 33 may be coated to a thickness of about 100 Å to about 50,000 Å using a typical film coating method such as extrusion, spin coating, or knife coating, vacuum deposition, or chemical vapor deposition (CVD).

Hereinafter, a method of forming a fine pattern of the organic layer of the OLED using the donor substrate according to an exemplary embodiment of the present invention will be described in detail with reference to FIG. 6. For convenience of the following description, the OLED will be adopted as one example to which the donor substrate is applied. However, application of the donor substrate is not limited to the OLED.

Figure 6:
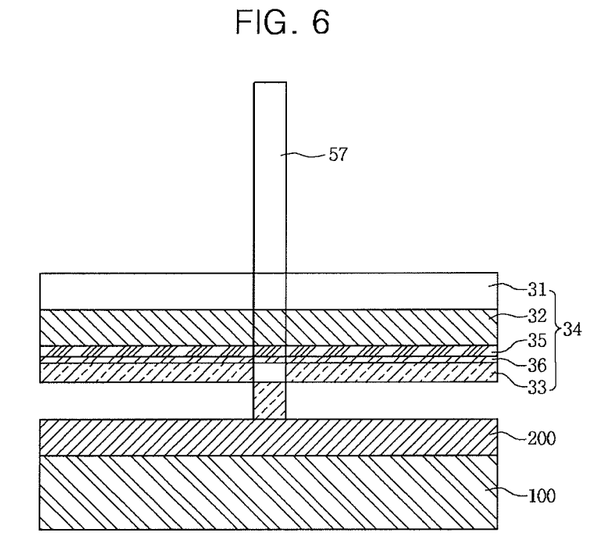
FIG. 6 is a cross-sectional view for explaining a transferring method using a donor substrate according to an exemplary embodiment of the present invention.

FIG. 6 is a cross-sectional view for explaining a transferring method using a donor substrate according to an exemplary embodiment of the present invention.

In one embodiment, as shown in FIG. 6, first, a lower electrode layer 200 is formed on a transparent substrate 100 of the OLED. Aside from this, a donor substrate 34 in which an LTHC layer 32, an interlayer 35 and a buffer layer 36 are coated on a base film 31 is prepared. A transfer layer 33 is formed on the donor substrate 34. Although not illustrated, the buffer layer 36 may be formed on the LTHC layer 32 without the interlayer 35.

Here, the transfer layer 33 may be formed by coating an organic layer forming material. At this time, to improve various characteristics, a predetermined content of additional material may be added. For example, to enhance efficiency of an emission layer, dopants may be added. As described above, the method of forming the transfer layer 33 may use a typical film coating method such as extrusion, spin coating, or knife coating.

The buffer layer 36 may be formed of magnesium (Mg) or an Mg alloy in the case of metal, and magnesium oxide (MgO) in the case of metal oxide.

As described above, as the transfer layer 33, only one layer may be formed using an organic material, and if necessary, two or more layers may be stacked.

In one embodiment, the donor substrate 34 is disposed at a position where it is spaced apart from the substrate 100 having the lower electrode layer 200 by a predetermined distance, and then an energy source 57 irradiates the donor substrate 34.

The energy source 57 transmits the base film 31 via a transfer device to activate the LTHC layer 32, and thus radiates heat by a pyrolytic reaction.

Due to this radiated heat, the LTHC layer 32 of the donor substrate is expanded, and thus the transfer layer 33 is separated from the donor substrate 34. Thereby, an emission layer formed of a transfer material is transferred onto a pixel region defined by a pixel definition layer above the substrate 100 of the OLED in a desired pattern at a desired thickness.

In one embodiment, the buffer layer 36 is used to be able to improve transfer pattern characteristics so as to enhance surface characteristics, particularly the adhesive strength between the donor substrate 34 and the transfer layer 33 in the event of laser induced thermal imaging to prevent the substrate from being stained with a small molecule material.

The energy source used in the above embodiment may include a laser, a xenon (Xe) lamp, or a flash lamp. Among them, the laser is generally advantageous in that it produces a desirable transfer effect. At this time, the laser may be any universal laser such as a solid laser, gas, semiconductor, dye laser, and so on. Further, the laser may be a circular beam or a beam having another possible shape.

In one embodiment, after the transferring process as mentioned above, a heat treatment process is carried out to solidify and fixate the transferred material.

Here, the transfer material may be transferred once or several times. In other words, in connection with the thickness of the small molecule organic layer to be transferred, the transfer material may be transferred to a desired thickness at one time, or repeatedly several times. However, taking convenience and stability of the transferring process into consideration, it may be advantageous to transfer the transfer material at one time.

In the following, an exemplary embodiment and comparative example are described. The following exemplary embodiment is merely illustrative, and thus the present invention is not limited to the following exemplary embodiment.

Exemplary Embodiment

First, as illustrated in FIG. 6, a lower electrode layer was formed on a transparent substrate. Aside from this, a donor substrate in which an LTHC layer, an interlayer, and a buffer layer were coated on a base film was prepared. A transfer layer was formed on the donor substrate.

Here, the buffer layer was formed of metal, magnesium (Mg), to a thickness of 80 Å by sputtering. Although the exemplary embodiment used the buffer layer formed of magnesium (Mg) and having a thickness of 80 Å, substantially the same or similar result can be obtained using the buffer layer formed of an Mg alloy or magnesium oxide and having a thickness of 1 μm or less. Then, the donor substrate was disposed at a position where it was spaced apart from the substrate having the lower electrode layer by a predetermined distance, and then an energy source irradiated the donor substrate. Thereby, the transfer layer formed of a transfer material was transferred onto the lower electrode layer.

Comparative Example

The comparative example was identical to Exemplary Embodiment, except that the buffer layer was formed of aluminum (Al) to a thickness of 300 Å.

Figure 7:
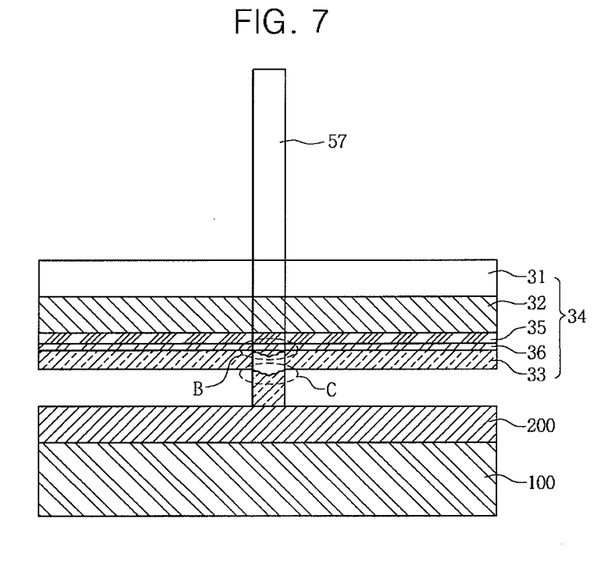
FIG. 7 is a cross-sectional view for explaining transfer characteristics when transfer is performed using a donor substrate according to a comparative example.

FIG. 7 is a cross-sectional view for explaining transfer characteristics when transfer is performed using a donor substrate according to Comparative Example.

Referring to FIG. 7, in the case of Comparative Example in which the buffer layer was formed of aluminum (Al), it could be found that the problem that, as in part A of FIG. 3 as described above, due to poor adhesive strength between the transfer layer and the donor substrate, the OLED substrate was stained with an organic material on the donor substrate when a laminating process was performed, so that the OLED substrate being covered with an undesired organic material was solved.

In detail, the buffer layer was used to be able to improve transfer pattern characteristics so as to enhance surface characteristics, particularly an adhesive strength between the donor substrate and the transfer layer in the event of laser induced thermal imaging to prevent the substrate from being stained with a small molecule material.

However, in the case where the buffer layer was formed of aluminum (Al), the adhesive strength between the transfer layer and the donor substrate was excessive, so that the material of the transfer layer of the region to be transferred actually remained in part, as illustrated in part B of FIG. 7. For this reason, as illustrated in part C of FIG. 7, cracks were formed on an upper surface of the transferred pattern.

Figure 8:
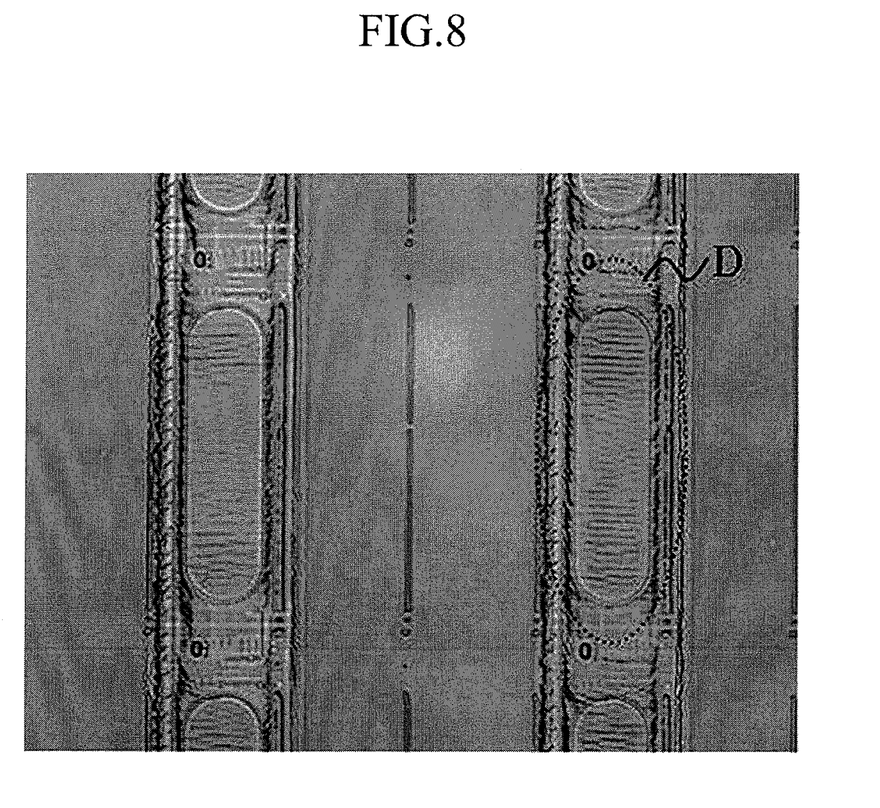
FIGS. 8 and 9 are photographs for explaining transfer characteristics when transfer is performed using a donor substrate according to a comparative example.
Figure 9:
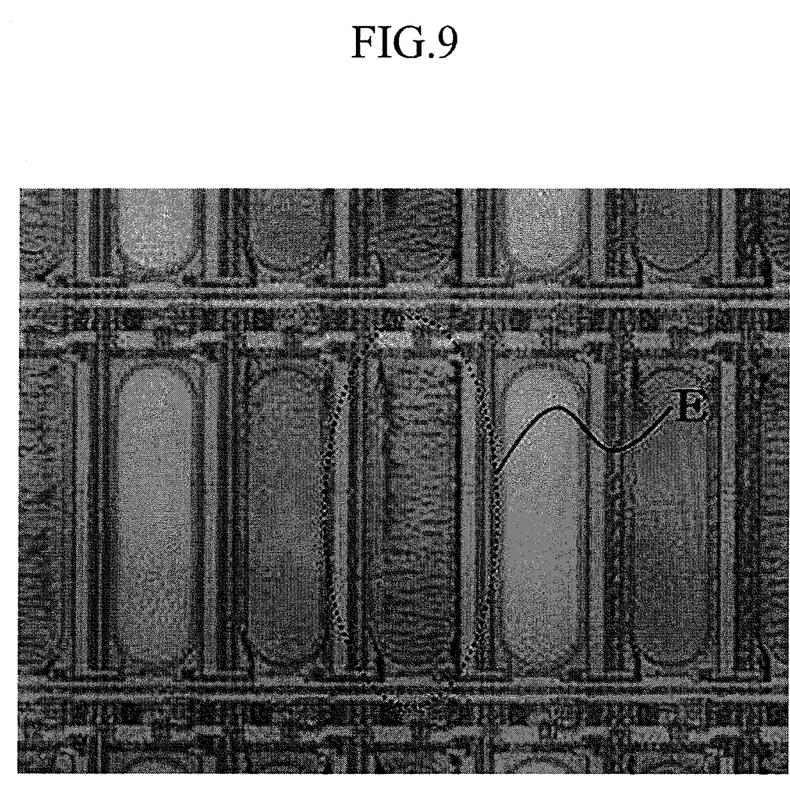

FIGS. 8 and 9 are photographs for explaining transfer characteristics when transfer is performed using a donor substrate according to Comparative Example.

First, FIG. 8 shows a donor substrate after laser induced thermal imaging is performed. Referring to region D of FIG. 8, it can be found that the material of the transfer layer of the region to be transferred as illustrated in part B of FIG. 7 described above partially remains on the donor substrate.

Next, FIG. 9 shows an OLED substrate having a transferred pattern after laser induced thermal imaging is performed. Referring to region E of FIG. 9, it can be found that cracks are formed on the upper surface of the transferred pattern as illustrated in part C of FIG. 7 described above.

Figure 10:
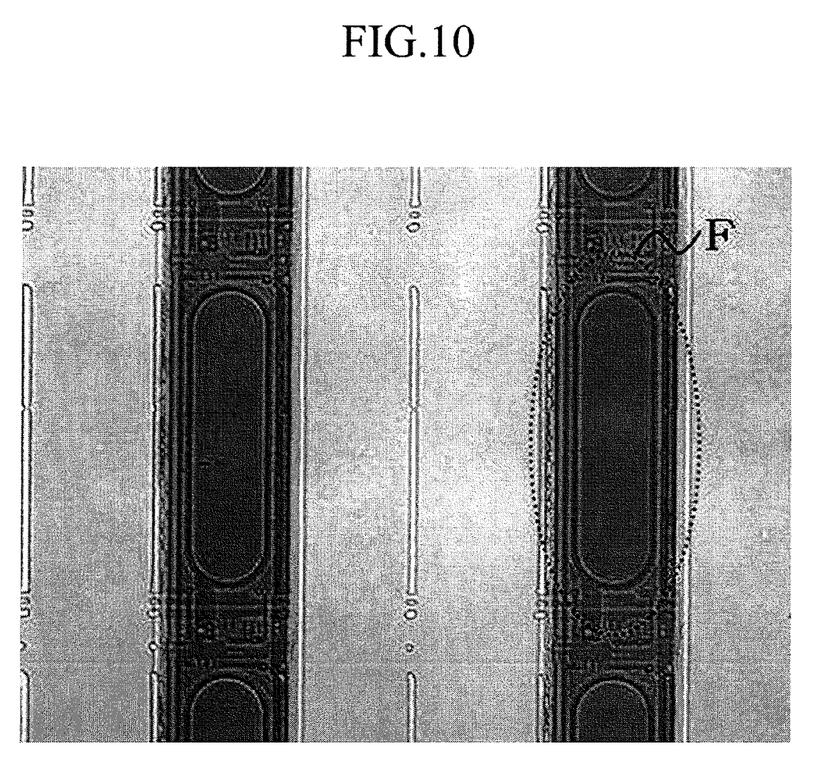
FIGS. 10 and 11 are photographs for explaining transfer characteristics when transfer is performed using a donor substrate according to an exemplary embodiment.
Figure 11:
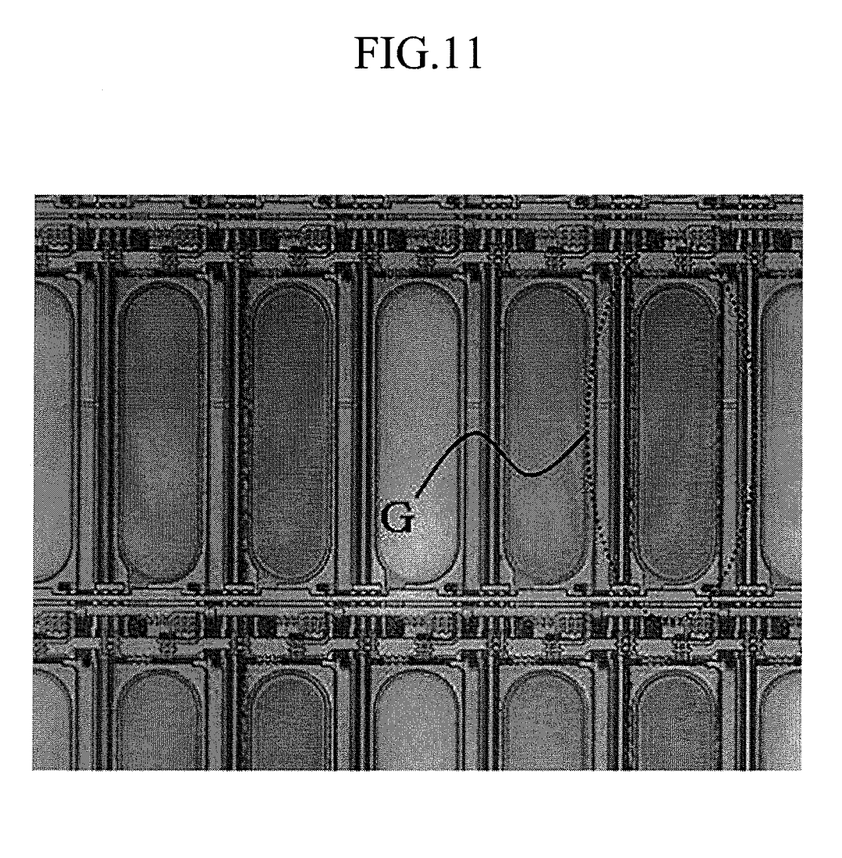

Meanwhile, FIGS. 10 and 11 are photographs for explaining transfer characteristics when transfer is performed using a donor substrate according to an to exemplary embodiment. In detail, FIGS. 10 and 11 are photographs showing transfer characteristics when Mg is used for a buffer layer.

First, FIG. 10 shows a donor substrate after laser induced thermal imaging is performed. Referring to region F of FIG. 10, it can be found that the material of the transfer layer of the region to be transferred as illustrated in part B of FIG. 7 described above is neatly transferred without partially remaining on the donor substrate.

Next, FIG. 11 shows an OLED substrate having a transferred pattern after laser induced thermal imaging is performed. Referring to region G of FIG. 11, it can be found that the transfer material is neatly patterned without forming cracks on the upper surface of the transferred pattern as illustrated in part C of FIG. 7 described above.

In one embodiment of the present invention, the buffer layer is used to enable improvement of the transfer pattern characteristics so as to enhance the surface characteristics, particularly the adhesive strength between the donor substrate and the transfer layer in the event of laser induced thermal imaging to prevent the OLED substrate from being stained with the small molecule material. In this embodiment, the buffer layer is formed using magnesium (Mg), an Mg alloy, or magnesium oxide, the material of the transfer layer of the region to be transferred does not partially remain on the donor substrate, and the transfer material can be neatly patterned without forming cracks on the upper surface of the transferred pattern.

In a donor substrate for laser induced thermal imaging, a buffer layer is formed between an interlayer and a transfer layer or between a light-to-heat conversion layer and the transfer layer, so that surface characteristics between the donor substrate and the transfer layer can be improved, and thus transfer pattern characteristics can be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A donor substrate for laser induced thermal imaging, comprising:
   a base film;
   a light-to-heat conversion layer formed on the base film;
   a buffer layer formed of at least one of: magnesium (Mg) or an Mg alloy; and
   a transfer layer contacting the buffer layer, wherein the buffer layer is formed between the transfer layer and the light-to-heat conversion layer.

2. The donor substrate according to claim 1, wherein the buffer layer has a thickness of about 1 µm or less.

3. The donor substrate according to claim 1, wherein the buffer layer has a laser beam transmittance of about 20% or less.

4. The donor substrate according to claim 1, wherein the light-to-heat conversion layer is formed of one of i) an organic layer, and ii) a metal layer formed of metal, metal oxide, metal sulfide or a combination thereof, and wherein the organic layer and the metal layer comprise a laser beam absorbing material.

5. The donor substrate according to claim 1, further comprising an interlayer interposed between the light-to-heat conversion layer and the buffer layer.

6. The donor substrate according to claim 5, wherein the interlayer is formed of acrylic resin or alkyd resin.

7. The donor substrate according to claim 1, wherein the transfer layer comprises at least one of: i) an emission layer, ii) a hole injection layer, iii) a hole transport layer, iv) an electron injection layer, and v) an electron transport layer.

8. A donor substrate for laser induced thermal imaging, comprising:
   a base film having first and second surfaces opposing each other, wherein the base film is configured to receive light via the first surface and at least partially transmit the light via the second surface;
   a light-to-heat conversion layer contacting the second surface of the base film and configured to partially convert the light into heat;
   a transfer layer configured to transfer at least a portion thereof based on the heat; and
   a buffer layer formed between the light-to-heat conversion layer and the transfer layer, wherein the buffer layer is formed of at least one of: magnesium (Mg) or an Mg alloy.

9. The donor substrate according to claim 8, wherein the buffer layer has a thickness of about 1 µm or less.

10. The donor substrate according to claim 8, wherein the buffer layer has a laser beam transmittance of about 20% or less.

11. The donor substrate according to claim 8, wherein the light-to-heat conversion layer is formed of one of i) an organic layer, and ii) a metal layer formed of metal, metal oxide, metal sulfide or a combination thereof, wherein the organic layer and the metal layer comprises a laser beam absorbing material.

12. The donor substrate according to claim 8, further comprising an interlayer formed interposed between the light-to-heat conversion layer and the buffer layer.

13. The donor substrate according to claim 12, wherein the interlayer is formed of acrylic resin or alkyd resin.

14. The donor substrate according to claim 8, wherein the transfer layer is formed of at least one of: i) an emission layer, ii) a hole injection layer, iii) a hole transport layer, iv) an electron injection layer, and v) an electron transport layer.

15. The donor substrate according to claim 8, wherein the base film is formed of a transparent polymeric material and has a thickness of about 10 µm to about 500 µm.

* * * * *